US012575099B2

(12) United States Patent
Park et al.

(10) Patent No.: US 12,575,099 B2
(45) Date of Patent: Mar. 10, 2026

(54) METHOD FOR FABRICATING A SEMICONDUCTOR DEVICE

(71) Applicant: SK hynix Inc., Icheon-si (KR)

(72) Inventors: Jun Hyuk Park, Icheon-si (KR); Kyung Min Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 618 days.

(21) Appl. No.: 17/404,638

(22) Filed: Aug. 17, 2021

(65) Prior Publication Data

US 2022/0320134 A1 Oct. 6, 2022

(30) Foreign Application Priority Data

Mar. 31, 2021 (KR) ........................ 10-2021-0042011

(51) Int. Cl.
| | |
|---|---|
| *H10B 43/27* | (2023.01) |
| *H10B 41/10* | (2023.01) |
| *H10B 41/27* | (2023.01) |
| *H10B 41/35* | (2023.01) |
| *H10B 43/10* | (2023.01) |
| *H10B 43/35* | (2023.01) |

(52) U.S. Cl.
CPC ............. *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 43/27; H10B 41/10; H10B 41/27; H10B 41/35; H10B 43/10; H10B 43/35; H10B 43/30; H10D 84/0149; H10D 84/0151; H10D 84/016
See application file for complete search history.

(56) References Cited

U.S. PATENT DOCUMENTS

| | | | | |
|---|---|---|---|---|
| 9,548,313 B2 * | 1/2017 | Yada | ...................... | H10B 43/35 |
| 2008/0054409 A1 * | 3/2008 | Shim | ................ | H01L 21/76224 |
| | | | | 257/E21.546 |
| 2009/0170281 A1 * | 7/2009 | Cho | ...................... | H10B 41/30 |
| | | | | 257/E21.179 |
| 2012/0181692 A1 * | 7/2012 | Heinrich | ............... | H01L 23/485 |
| | | | | 438/653 |

(Continued)

FOREIGN PATENT DOCUMENTS

| | | |
|---|---|---|
| CN | 111863831 A | 10/2020 |
| KR | 1020090072089 A | 7/2009 |

(Continued)

*Primary Examiner* — Jacob Y Choi
*Assistant Examiner* — Ashley Nicole Blackwell
(74) *Attorney, Agent, or Firm* — WILLIAM PARK AND ASSOCIATES LTD.

(57) ABSTRACT

A semiconductor device and a method for fabricating the semiconductor device. The method comprises: forming a stack structure including a lower level sacrificial layer over a semiconductor substrate; forming a slit penetrating through the stack structure and exposing the lower level sacrificial layer; forming a spacer on a sidewall of the slit; forming horizontal recesses by removing the lower level sacrificial layer; forming a conductive material in each of the horizontal recesses; etching the conductive material to form source channel contacts filling the horizontal recesses, respectively, and to form a separation groove between the conductive patterns; and forming an etch barrier material filling the separation groove.

24 Claims, 17 Drawing Sheets

(56) References Cited

U.S. PATENT DOCUMENTS

| | | | | |
|---|---|---|---|---|
| 2015/0079743 | A1* | 3/2015 | Pachamuthu | H10B 41/20 |
| | | | | 438/268 |
| 2015/0348984 | A1 | 12/2015 | Yada et al. | |
| 2017/0178952 | A1* | 6/2017 | Jung | H01L 21/02282 |
| 2019/0355742 | A1 | 11/2019 | Maruyama et al. | |
| 2020/0051997 | A1* | 2/2020 | Park | H10B 63/845 |
| 2020/0075717 | A1 | 3/2020 | Cheng et al. | |
| 2020/0194450 | A1 | 6/2020 | Pachamuthu et al. | |
| 2020/0328226 | A1* | 10/2020 | Park | H01L 21/76895 |
| 2021/0159233 | A1* | 5/2021 | Lee | H10B 43/23 |
| 2021/0175241 | A1* | 6/2021 | Ryu | H10B 63/34 |

FOREIGN PATENT DOCUMENTS

| | | | |
|---|---|---|---|
| KR | 1020200018064 | A | 2/2020 |
| KR | 1020200120112 | A | 10/2020 |

* cited by examiner

METHOD FOR FABRICATING A SEMICONDUCTOR DEVICE

CROSS-REFERENCE TO RELATED APPLICATIONS

The present application claims priority to Korean Patent Application No. 10-2021-0042011, filed on Mar. 31, 2021, which is herein incorporated by reference in its entirety.

BACKGROUND

1. Technical Field

The present disclosure relates to a semiconductor device and, more particularly, to a method for fabricating a semiconductor device.

2. Related Art

Fabricating an electrical device such as a semiconductor device requires a gap-fill for a three-dimensional (3D) structure or a high aspect ratio structure. A gap-fill of a high aspect ratio structure is being performed, for example, in fabricating a vertical semiconductor device.

SUMMARY

According to an embodiment, a method for fabricating a semiconductor device may comprise: forming a stack structure including a lower level sacrificial layer over a semiconductor substrate; forming a slit penetrating through the stack structure and exposing the lower level sacrificial layer; forming a spacer on a sidewall of the slit; forming horizontal recesses by removing the lower level sacrificial layer; forming a conductive material in each of the horizontal recesses; etching the conductive material to form source channel contacts filling the horizontal recesses, respectively, and to form a separation groove between the source channel contacts; and forming an etch barrier material filling the separation groove.

According to an embodiment, method for fabricating a semiconductor device may comprise: forming a lower level stack including a sacrificial source layer over a semiconductor substrate and an upper level stack in which a plurality of insulating layers and a plurality of sacrificial layers are alternately stacked over the lower level stack; forming a plurality of vertical channel structures each including a channel layer, the channel layer penetrating through the upper level stack and the lower level stack; forming a slit dividing the upper level stack into a first alternating stack and a second alternating stack; exposing the sacrificial source layer to expand the slit by partially etching the lower level stack; forming a spacer on a sidewall of the slit; forming horizontal recesses extending from the slit by removing the sacrificial source layer; forming source channel contacts filling the horizontal recesses, respectively, and a separation groove between the source channel contacts; forming an etch barrier material filling the separation groove.

According to an embodiment, a semiconductor device may comprise: a source level stack including a first horizontal recess and a second horizontal recess; a gate stack of gate electrodes over the source level stack and of insulating layers; a vertical channel including a channel layer, the channel layer penetrating through the gate stack and the source level stack; source channel contacts filling the first and second horizontal recesses, respectively; and a separation groove between the source channel contacts, wherein the source channel contacts may include an embedded void, and a side of the channel source contacts may be oxide-free, the channel source contacts being exposed by the separation groove.

DETAILED DESCRIPTION

Figure 1:
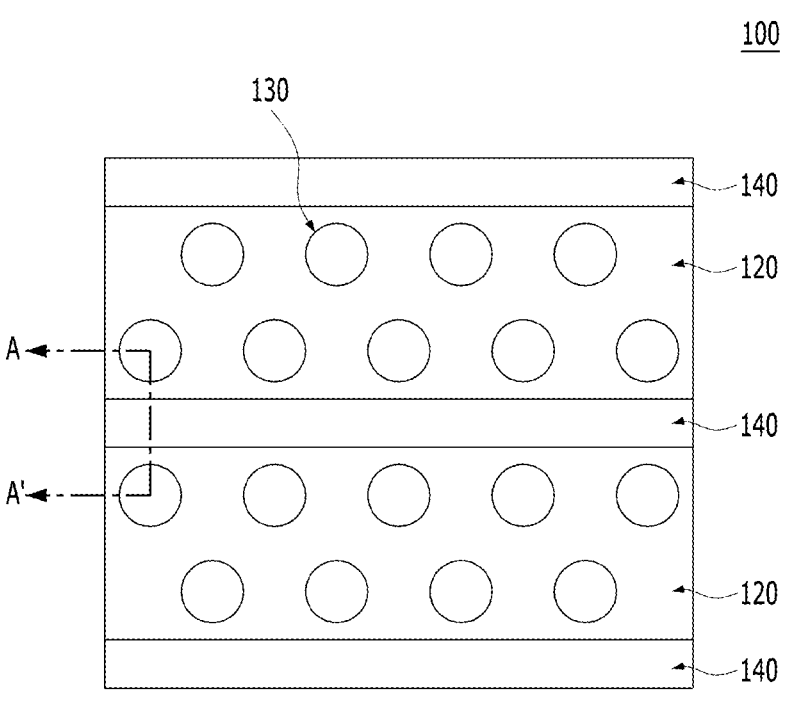
FIGS. 1 and 2 are diagrams illustrating a vertical semiconductor device according to an embodiment of the present disclosure.

Various embodiments described herein will be described with reference to cross-sectional views, plane views and block diagrams, which are ideal schematic views of the present disclosure. Therefore, the structures of the drawings may be modified by fabricating technology and/or tolerances. The embodiments of the present disclosure are not limited to the specific structures shown in the drawings, but include any changes in the structures that may be produced according to the fabricating process. Also, any regions and shapes of regions illustrated in the drawings have schematic views, are intended to illustrate specific examples of structures of regions of the various elements, and are not intended to limit the scope of the embodiments.

Various embodiments of the present disclosure provide a method for fabricating a semiconductor device capable of improving reliability.

In the present disclosure, an attack of a void or a seam can be prevented or mitigated in the source channel contacts by forming an etch barrier material containing carbon.

The present disclosure can improve the reliability and yield of a semiconductor device by preventing or mitigating the attack of a void or a seam of the source channel contact.

Figure 2:
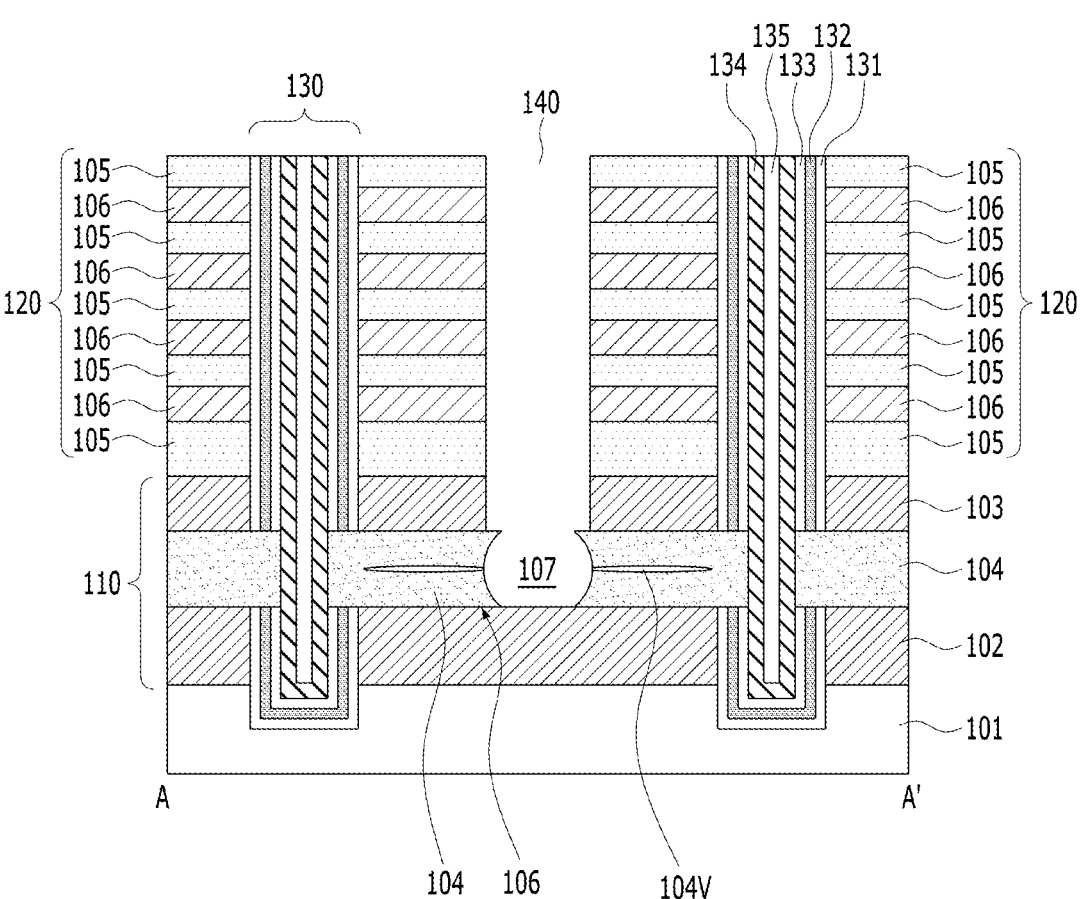

FIGS. 1 and 2 are diagrams illustrating a vertical semiconductor device according to an embodiment. FIG. 2 is a cross-sectional view taken along line A-A' of FIG. 1.

Referring to FIGS. 1 and 2, a vertical semiconductor device 100 may include a NAND of a 3D structure. The vertical semiconductor device 100 may include a semiconductor substrate 101, a source level stack 110 over the semiconductor substrate 101, and a plurality of gate stacks 120 over the source level stack 110. The source level stack 110 may include source layers 102 and 103 and a plurality of source channel contacts 104.

The gate stacks 120 may be a stack including gate electrodes. In each of the gate stacks 120, insulating layers 105 and gate electrodes 106 may be alternately stacked. An insulating layer at the lowermost level among the insulating layers 105 may be thicker than other insulating layers among the insulating layers 105. The insulating layers 105 may include silicon oxide. The gate electrodes 106 may include a metal-base material. The gate electrodes 106 may include tungsten or a stack of titanium nitride and tungsten. The gate electrodes 106 may be referred to as word lines.

The vertical semiconductor device 100 may further include vertical channel structures 130 penetrating through the gate stacks 120 and the source level stack 110. Each of the vertical channel structures 130 may include a memory layer, a channel layer 134, and a core insulating layer 135.

The core insulating layer 135 may fill a space inside the channel layer 134. The memory layer may surround an outer wall of the channel layer 134. The memory layer may be a stack structure including a blocking layer 131, a charge trap layer 132, and a tunnel insulating layer 133. The tunnel insulating layer 133 may be formed over the channel layer 134. The charge trap layer 132 may be formed over the tunnel insulating layer 133. The blocking layer 131 may be formed over the charge trap layer 132. The blocking layer 131 and the tunnel insulating layer 133 may include silicon oxide. The charge trap layer 132 may include silicon nitride. The memory layer may have an oxide-nitride-oxide (ONO) structure. The channel layer 134 may include polysilicon layer. The channel layer 134 may have a cylinder shape including an inner space. The outer wall of the channel layer 134 may be surrounded by the memory layer. The inner space of the channel layer 134 may be completely filled with the core insulating layer 135. The core insulating layer 135 may include silicon oxide or silicon nitride. The charge trap layer 132 may be referred to as a charge storage layer or a data storage layer. The charge trap layer 132 may be formed of a charge trap material.

A lower portion of the vertical channel structure 130 may penetrate through the source level stack 110. An upper portion of the vertical channel structure 130 may penetrate through the gate stacks 120. The vertical semiconductor device 100 may further include a slit 140 between the gate stacks 120. The slit 140 may be spaced apart from the vertical channel structures 130. The slit 140 may have a trench-shape. Neighboring gate stacks 120 may be spaced apart by the slit 140.

A detailed description of the source level stack 110 is as follows.

The source level stack 110 may include source layers 102 and 103 and a source channel contact 104 between the source layers 102 and 103. The source layers 102 and 103 may include a lower source layer 102 and an upper source layer 103, respectively. The vertical channel structures 130 may penetrate through the lower source layer 102 and the upper source layer 103.

The source level stack 110 may further include a horizontal recess 106. The horizontal recess 106 may be defined between the lower source layer 102 and the upper source layer 103. Neighboring horizontal recesses 106 may be spaced apart by a separation groove 107. The separation groove 107 may be vertically extended from the slit 140. The slit 140 may penetrate through the upper source layer 103. Neighboring upper source layers 103 may be spaced apart from each other by the slit 140. Neighboring source channel contacts 104 may be spaced apart from each other by the separation groove 107. The source channel contact 104 may be formed in each of the horizontal recesses 106. The source channel contacts 104 may be formed between the lower source layer 102 and the upper source layer 103. The source channel contacts 104 may fill the horizontal recesses 106. The lower source layer 102 and the upper source layer 103 may be made of the same material, for example a semiconductor material such as polysilicon. The source channel contacts 104 may include a semiconductor material such as polysilicon.

Each of the source channel contacts 104 may include a void 104V. The separation groove 107 may be formed between the neighboring source channel contacts 104. The voids 104V may be spaced apart from each other by separation grooves 107. The separation groove 107 and the slit 140 may be connected vertically. A sidewall of the separation groove 107 may include a rounded sidewall.

The source channel contact 104 may include a phosphorus-doped polysilicon layer. In another embodiment, the source channel contact 104 may include a phosphorus-doped epitaxial silicon layer.

As described above, the channel layer 134 and the source channel contact 104 may directly contact each other. The source channel contact 104 may include the void 104V therein. The void 104V may be referred to as an embedded void. The rounded sidewall of the source channel contact 104 may be oxide-free.

FIGS. 3 to 17 are diagrams illustrating a method for fabricating a vertical semiconductor device according to an embodiment. Hereinafter, FIGS. 3 to 17 may be cross-sectional views taken along line A-A' of FIG. 1.

Figure 3:
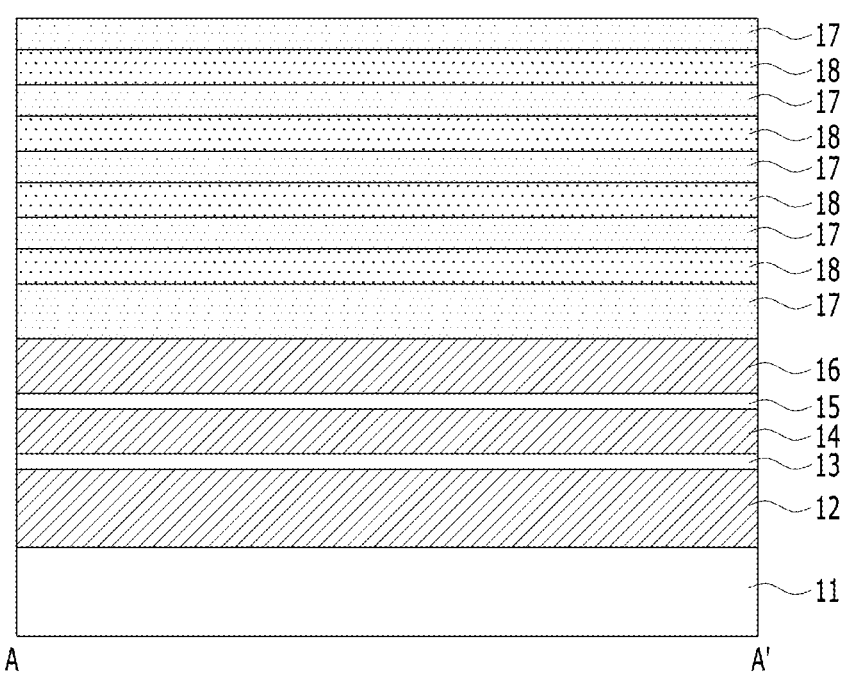
FIGS. 3, 4, 5, 6, 7, 8, 9, 10, 11, 12, 13, 14, 15, 16, and 17 are diagrams illustrating a method for fabricating a semiconductor device according to an embodiment of the present disclosure.

As shown in FIG. 3, a stack structure may be formed over a semiconductor substrate 11. The stack structure may include a lower level stack and an upper level stack. The lower level stack may include a lower source layer 12, an upper source layer 16, liner layers 13 and 15, and a sacrificial source layer 14. The sacrificial source layer 14 may be formed between the lower source layer 12 and the upper source layer 16. The liner layer 13 may be formed between the sacrificial source layer 14 and the lower source layer 12. The liner layer 15 may be formed between the sacrificial source layer 14 and the upper source layer 16. The lower source layer 12, the sacrificial source layer 14, and the upper source layer 16 may be made of the same material. The liner layers 13 and 15 may be made of different materials from the lower source layer 12, the sacrificial source layer 14, and the upper source layer 16. The lower source layer 14, the sacrificial source layer 14, and the upper source layer 16 may have an etch selectivity with respect to the liner layers 13 and 15. The lower source layer 12, the sacrificial source layer 14, and the upper source layer 16 may include a semiconductor material. The liner layers 13 and 15 may include an insulating material. The lower source layer 12, the sacrificial source layer 14, and the upper source layer 16 may include polysilicon. The liner layers 13 and 15 may include silicon oxide. The liner layers 13 and 15 may be thinner than the lower source layer 12, the sacrificial source layer 14, and the upper source layer 16. For example, the liner layer 13 may be thinner than any one of the lower source layer 12, the sacrificial source layer 14, and the upper source layer 16. For example, the liner layer 15 may be thinner than any one of the lower source layer 12, the sacrificial source layer 14, and the upper source layer 16.

The upper level stack may include insulating layers 17 and sacrificial layers 18 stacked on the upper source layer 16. In the upper level stack, insulating layers 17 and sacrificial layers 18 may be alternately stacked. The insulating layers 17 and the sacrificial layers 18 may be alternately stacked several times. The insulating layers 17 and the sacrificial layers 18 may be made of different materials. The insulating layers 17 may have an etch selectivity with respect to the sacrificial layers 18. The insulating layers 17 may include silicon oxide, and the sacrificial layers 18 may include silicon nitride. The insulating layers 17 and the sacrificial layers 18 may have the same thickness. The insulating layers 17 and the sacrificial layers 18 may be thicker than the liner layers 13 and 15. For example, the insulating layer 17 may be thicker than any one of the liner layers 13 and 15. For example the insulating layer 18 may be thicker than any one of the liner layers 13 and 15. The insulating layers 17 and the sacrificial layers 18 may be thinner than the lower source layer 12 and the upper source layer 16. For example, the insulating layer 17 may be thinner than any one of the lower source layer 12 and the upper source layer 16. For example, the sacrificial layer 18 may be thinner than any one of the lower source layer 12 and the upper source layer 16. Among the insulating layers 17, an insulating layer 17 at the lowermost level may be thicker than other insulating layers 17 among the insulating layers 17. For example, the lowermost level insulating layer 17 is thicker than other insulating layers 17 among the insulating layers 17 as shown in FIG. 3.

The insulating layers 17 and the sacrificial layers 18 may be formed using chemical vapor deposition (CVD) or atomic layer deposition (ALD).

The sacrificial source layer 14 may be referred to as a lower level sacrificial layer or a source level sacrificial layer. The sacrificial layers 18 may be referred to as an upper level sacrificial layer or a gate level sacrificial layer. As will be described later, the sacrificial source layer 14 may be replaced with a source channel contact. The sacrificial layers 18 may be replaced with gate electrodes.

Figure 4:
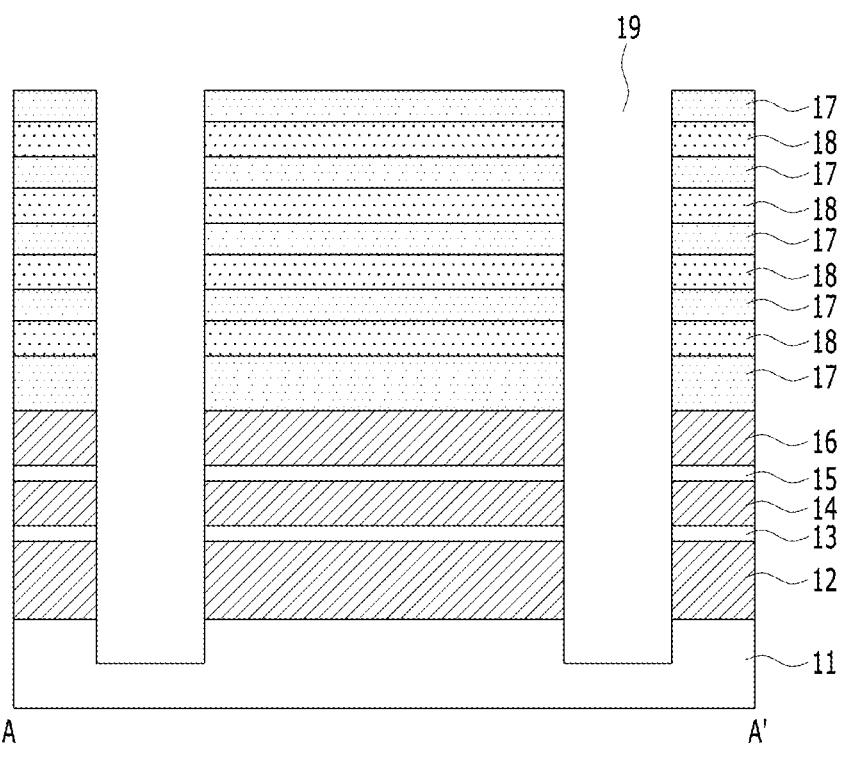

As shown in FIG. 4, a vertical opening 19 may be formed. The insulating layers 17, the sacrificial layers 18, the upper source layer 16, the liner layers 13 and 15, the sacrificial source layer 14, and the lower source layer 12 may be etched to form the vertical opening 19.

The vertical opening 19 may be formed vertical to a surface of the semiconductor substrate 11. The vertical opening 19 may have a shape penetrating through the insulating layers 17 and the sacrificial layers 18. The vertical opening 19 may be extended to penetrate through the upper source layer 16, the liner layers 13 and 15, the sacrificial source layer 14, and the lower source layer 12. Although not shown, when viewed in plane view, a plurality of vertical openings 19 may be formed and may have a hole array structure. When the vertical opening 19 is formed, the surface of the semiconductor substrate 101 may be partially recessed. In another embodiment, the vertical opening 19 may be referred to as 'a vertical recess', 'a vertical hole', or 'a channel hole'.

Figure 5:
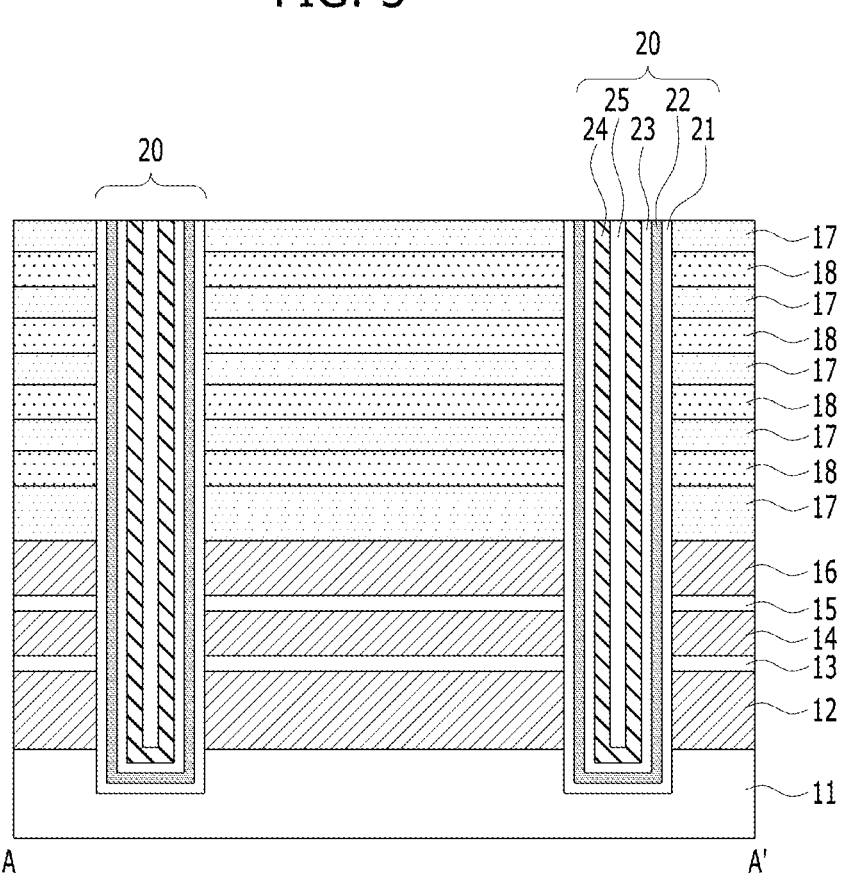

As shown in FIG. 5, a vertical channel structure 20 may be formed in the vertical opening 19. The vertical channel structure 20 may fill the vertical opening 19. The vertical channel structure 20 may be referred to as 'a pillar structure'.

The vertical channel structure 20 may include a memory layer, a channel layer 24, and a core insulating layer 25. The memory layer may have a stack structure including a blocking layer 21, a charge trap layer 22, and a tunnel insulating layer 23. The blocking layer 21 and the tunnel insulating layer 23 may include oxide. The charge trap layer 22 may include nitride. The memory layer may have an oxide-nitride-oxide (ONO) structure. The channel layer 24 may include a semiconductor material or an oxide semiconductor material. The channel layer 24 may include polysilicon or InGaZnO (IGZO). The channel layer 24 may have a cylinder shape including an inner space. The memory layer may surround an outer wall of the channel layer 24. The inner space of the channel layer 24 may be completely or partially filled with the core insulating layer 25. The core insulating layer 25 may include silicon oxide or silicon nitride.

Figure 6:
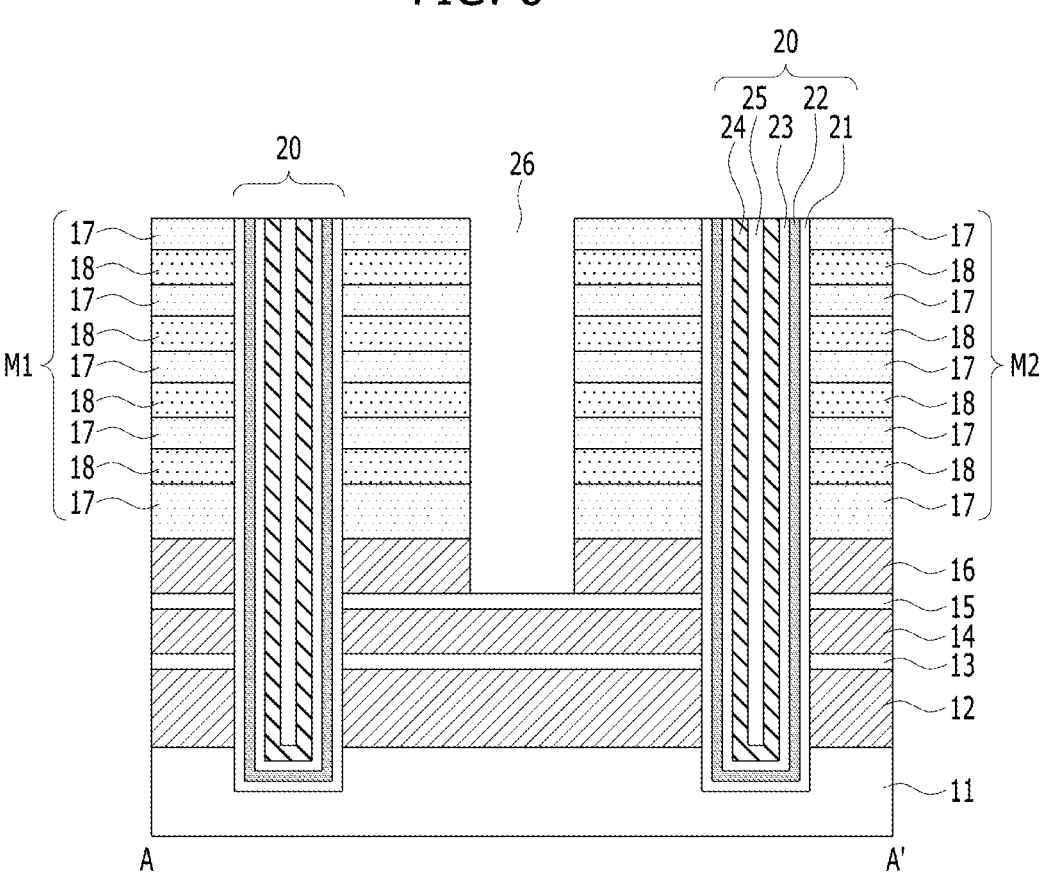

As shown in FIG. 6, a slit 26 may be formed. The slit 26 may be formed by etching the insulating layers 17 and the sacrificial layers 18. In order to form the slit 26, the insulating layers 17 and the sacrificial layers 18 may be etched, and the upper source layer 16 may be subsequently etched. A bottom surface of the slit 26 may penetrate through the upper source layer 16. The slit 26 may also be referred to as a trench. When viewed from a top view, the slit 26 may have a line shape extending in any one direction. The slit 26 may be formed vertical to the surface of the semiconductor substrate 11. The slit 26 may be referred to as a vertical slit.

As the slit 26 is formed, the upper level stack including the insulating layers 17 and the sacrificial layers 18 may be divided into a plurality of alternating stacks. For example, the upper level stack may be divided into a first alternating stack M1 and a second alternating stack M2 by the slit 26. In each of the first and second alternating stacks M1 and M2, a plurality of insulating layers 17 and a plurality of sacrificial layers 18 may be alternately stacked. A plurality of vertical channel structures 20 may penetrate through the first and second alternating stacks M1 and M2.

Figure 7:
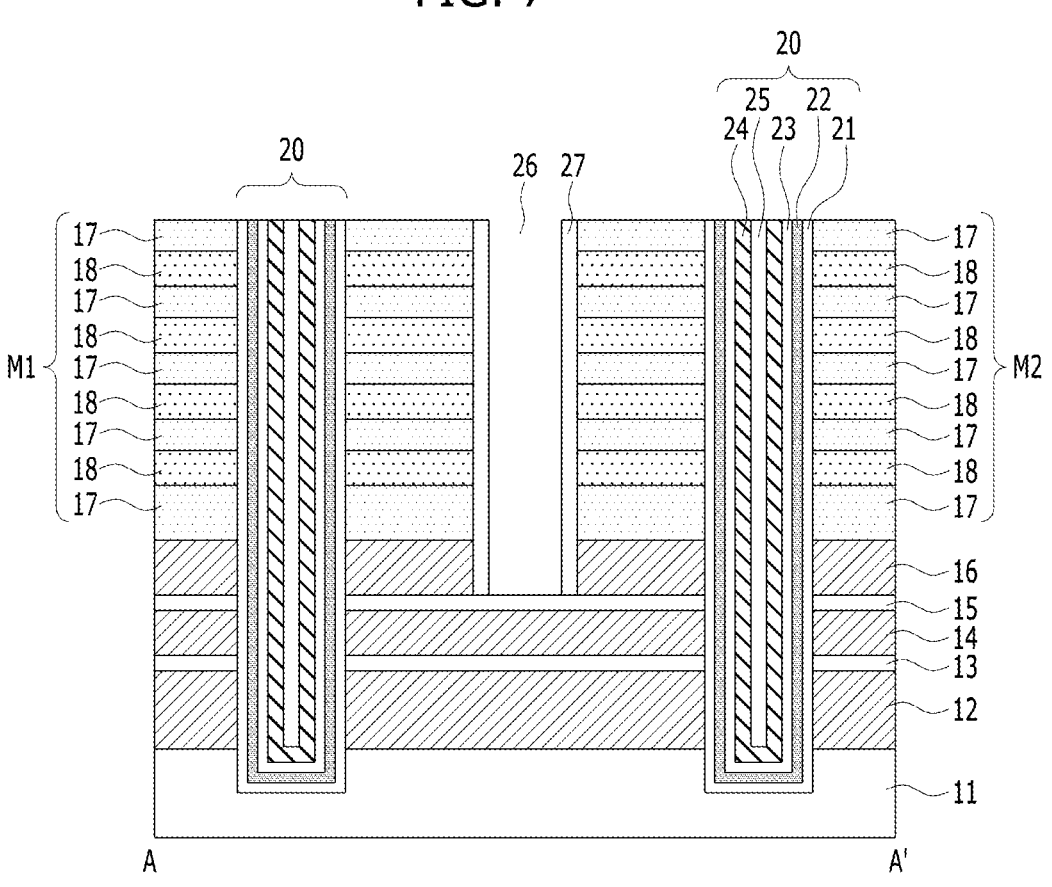

As shown in FIG. 7, a spacer 27 may be formed on a sidewall of the slit 26. The spacer 27 may include at least one of spacer materials. The spacer 27 may include an oxide, a nitride, or a combination thereof. For example, the spacer 27 may include a nitride-oxide-nitride stack, that is, a nitride-oxide-nitride (NON) structure.

Figure 8:
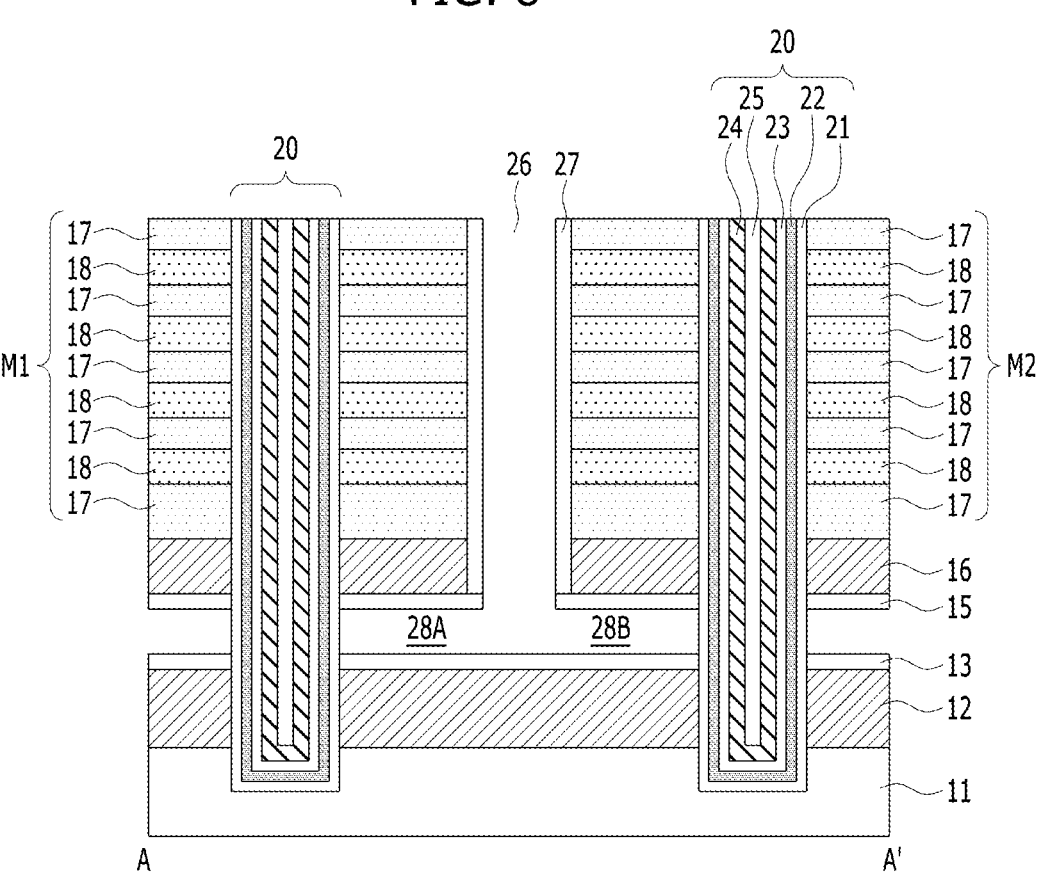

As shown in FIG. 8, the liner layer 15 and the sacrificial source layer 14 may be etched using the spacer 27 as a barrier. The liner layer 13 and the lower source layer 12 may remain without being etched.

Next, the sacrificial source layer 14 may be selectively removed through the slit 26. Accordingly, horizontal recesses 28A and 28B may be formed. The horizontal recesses 28A and 28B may be extended from the slit 26. The horizontal recesses 28A and 28B may be formed between the liner layers 13 and 15 by removing the sacrificial source layer 14 by a dip-out process. The horizontal recesses 28A and 28B may be parallel to the surface of the semiconductor substrate 11. When the sacrificial source layer 14 is removed, the liner layers 13 and 15 may remain without being removed due to an etch selectivity. The horizontal recesses 28A and 28B may be formed between the lower source layer 12 and the upper source layer 16. When the sacrificial source layer 14 is removed, the lower source layer 12 and the upper source layer 16 may remain without being removed. Wet etching may be applied to remove the sacrificial source layer 14. Since the sacrificial source layer 14 includes a polysilicon layer, wet etching may include a chemical capable of etching the polysilicon layer.

The horizontal recesses 28A and 28B may expose a lower outer wall of the vertical channel structures 20. The lower outer wall of the vertical channel structures 20 may be a part of the blocking layer 21. The horizontal recesses 28A and 28B may have a shape surrounding the lower outer wall of the vertical channel structures 20.

Figure 9:
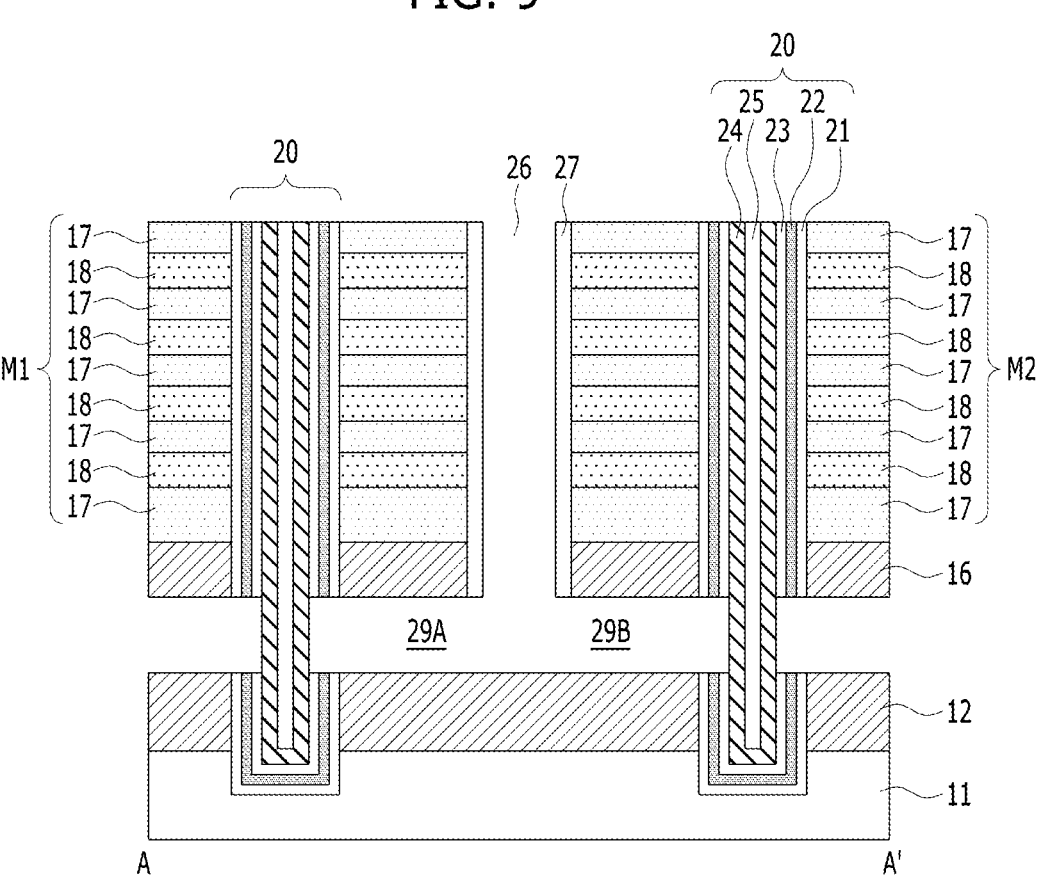

As shown in FIG. 9, the liner layers 13 and 15 may be removed. Accordingly, the volume of the horizontal recesses 28A and 28B may be increased. Horizontal recesses having an expanded volume may be formed as shown in reference numerals '29A' and '29B'. Hereinafter, the horizontal recesses having an expanded volume will be referred to as horizontal recesses 29A and 29B.

Next, the lower outer wall of the vertical channel structures 20 may be partially removed through the horizontal recesses 29A and 29B. For example, a portion of the memory layer, that is, the blocking layer 21, the charge trap layer 22, and the tunnel insulating layer 23 may be cut through the horizontal recesses 29A and 29B. Accordingly, the lower outer wall of the channel layers 24 of the vertical channel structures 20 may be exposed. In another embodiment, an undercut between the channel layer 24 and the lower source layer 12 and between the channel layer 24 and the upper source layer 16 may be formed as the blocking layer 21, the charge trap layer 22, and the tunnel insulating layer 23 are additionally etched.

Through a series of processes as described above, the horizontal recesses 29A and 29B may expose the lower outer wall of the channel layer 24.

The horizontal recesses 29A and 29B may have a first surface, the first surface being parallel to the semiconductor substrate 11. The slit 26 may be extended from the horizontal recesses 29A and 29B and have a second surface vertical to the surface of the semiconductor substrate 11. That is, a gap-fill target structure including the horizontal recesses 29A and 29B having the first surface and the slit having the second surface may be formed over the semiconductor substrate 11. The first surface may be provided by the channel layer 22, the lower source layer 12, and the upper source layer 16. In an embodiment the first surface may be provided by the memory layer, the lower source layer 12, and the upper source layer 16. The second surface may be provided by the spacer 27. The first surface may be a surface of a silicon layer, and the second surface may be a surface of an insulating material.

Figure 10:
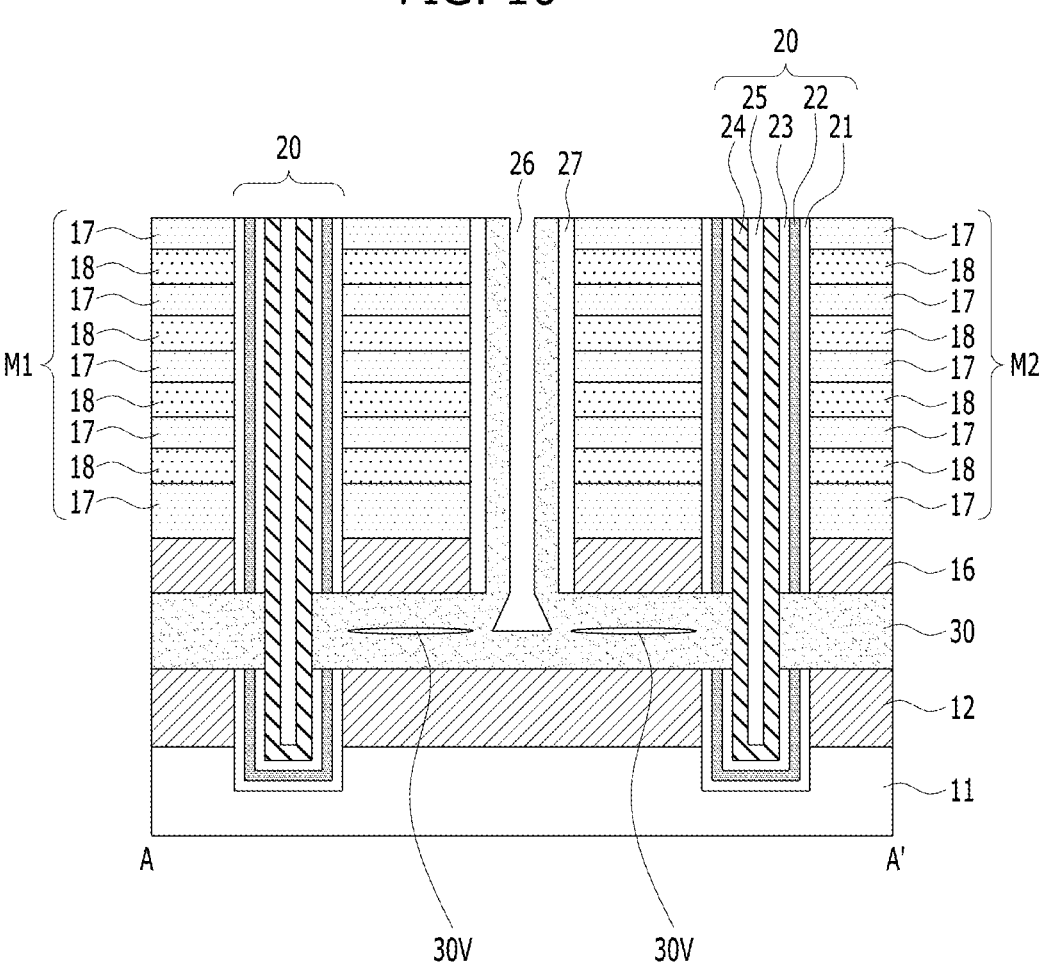

As shown in FIG. 10, a source contact layer 30 may be formed. The source contact layer 30 may be formed by a process of depositing a semiconductor material. The semiconductor material may include a polysilicon layer. The source contact layer 30 may fill the horizontal recesses 29A and 29B and may be conformally formed over the spacer 27. The source contact layer 30 might not fill the slit 26. The source contact layer 30 may include a seam or void 30V. That is, the source contact layer 30 may be formed of a void-embedded semiconductor material. In an embodiment, the source contact layer 30 may include a conductive material.

Figure 11:
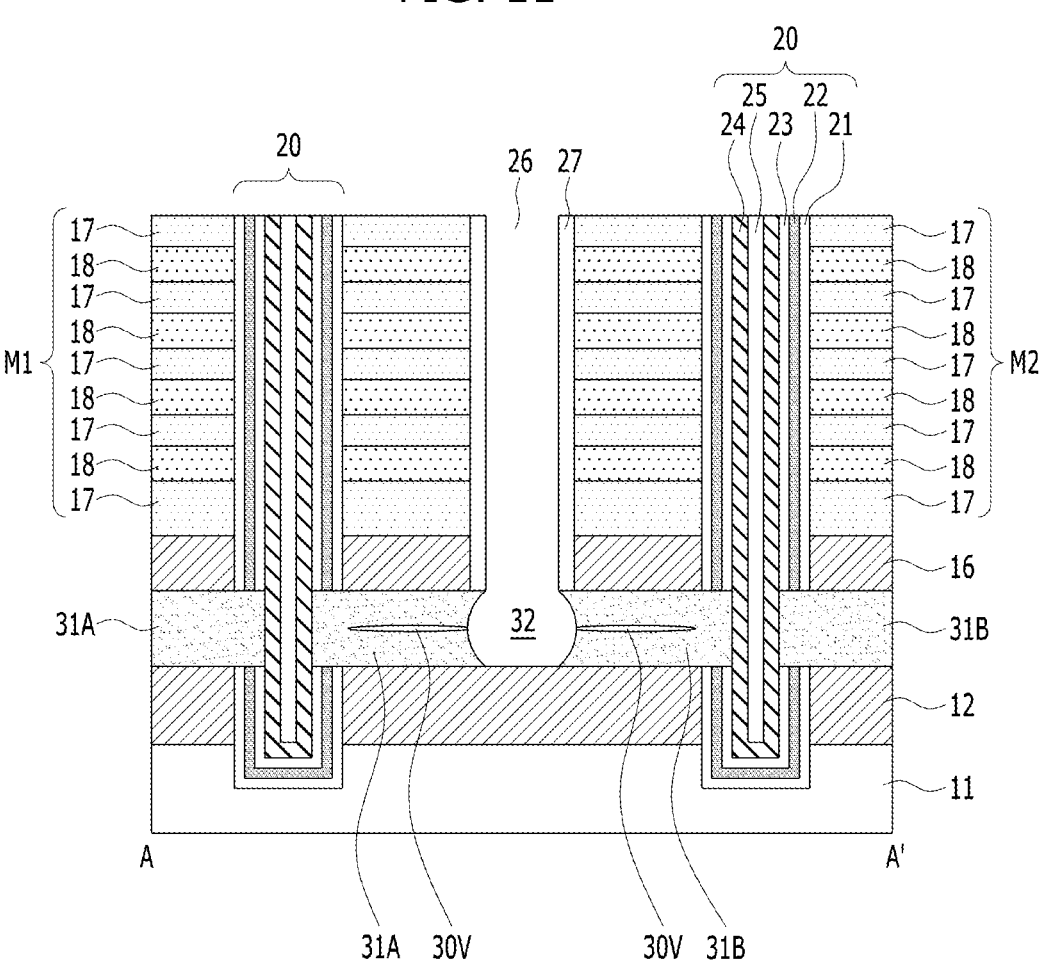

As shown in FIG. 11, the source contact layer 30 may be selectively removed to form source channel contacts 31A and 31B filling the horizontal recesses 29A and 29B, respectively. The source contact layer 30 may be selectively removed using wet etching. After wet etching, respective sides of the source channel contacts 31A and 31B may be exposed.

The neighboring source channel contacts 31A and 31B may be spaced apart from each other by a separation groove 32. The separation groove 32 and the slit 26 may be connected to each other. Respective sides of the neighboring source channel contacts 31A and 31B may be exposed by the separation groove 32.

By a series of processes as described above, the horizontal recesses 29A and 29B may be filled with the source channel contacts 31A and 31B, respectively. The source channel contacts 31A and 31B might not be formed in the slit 26. The source channel contacts 31A and 31B may include the void 30V. The source channel contacts 31A and 31B may directly contact the channel layer 24 of the vertical channel structure 20. Respective sides of the source channel contacts 31A and 31B exposed by the separation groove 32 may be oxide-free. Here, oxide-free may refer to a surface on which an oxide is not formed. In an embodiment, the source channel contacts 31A and 31B may include conductive material.

The lower source layer 12, the upper source layer 16, and the source channel contacts 31A and 31B may constitute a source level stack.

Figure 12:
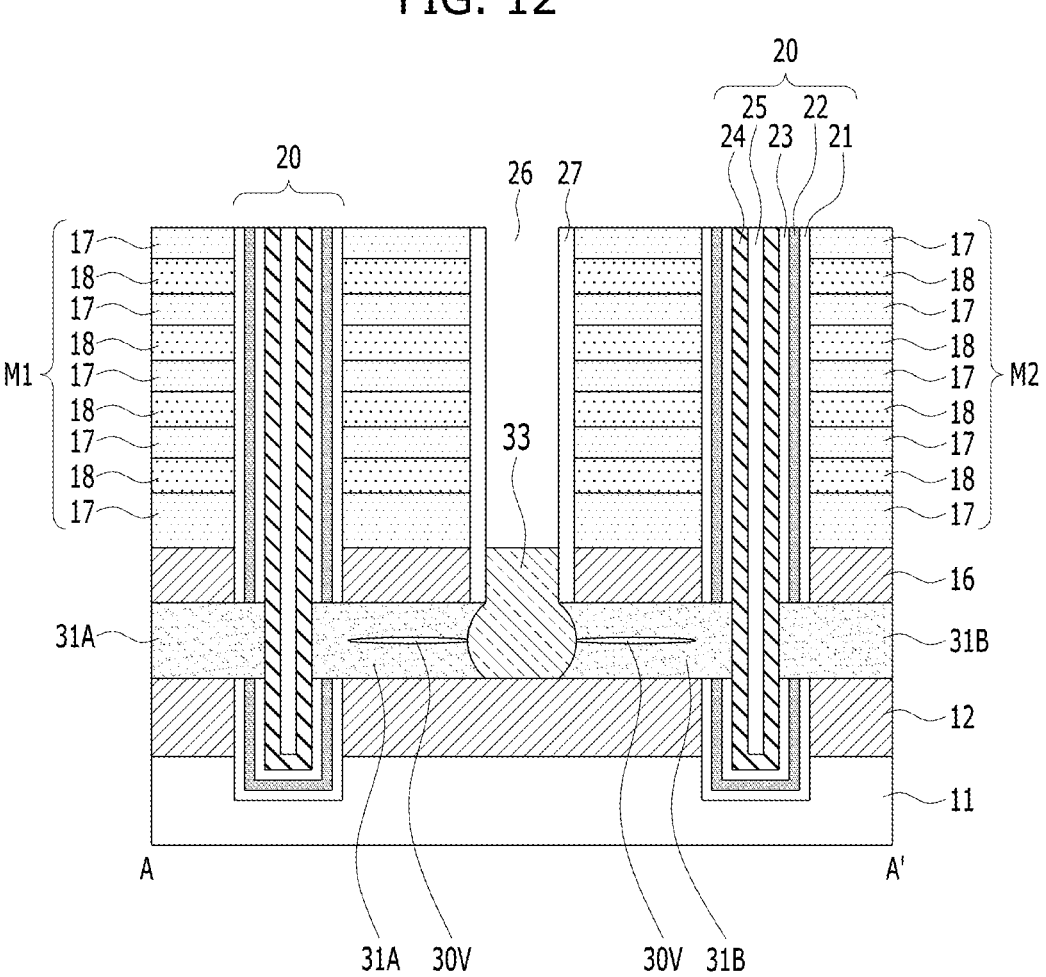

As illustrated in FIG. 12, an etch barrier material 33 may be formed to cover the respective sides of the source channel contacts 31A and 31B exposed by the separation groove 32. The etch barrier material 33 may gap-fill the separation groove 32. For example, an in-situ etch barrier material layer may be etched back in order to form the etch barrier material 33 after forming an etch barrier material layer (not shown) to fill the separation groove 32 and the slit 26.

The etch barrier material 33 may prevent or mitigate exposure of the source channel contacts 31A and 31B from a subsequent process. The etch barrier material 33 may protect the source channel contacts 31A and 31B from a subsequent removal process of the spacer 27. That is, the etch barrier material 33 may prevent or mitigate the exposed surfaces of the source channel contacts 31A and 31B and the void 30V from being attacked.

The etch barrier material 33 may include a void-free carbon-base material. The etch barrier material 33 may include a void-free carbon layer. The carbon-based material as the etch barrier material 33 has excellent gap-fill characteristics, and thus the separation groove 32 may be filled without a void with the etch barrier material 33. In another embodiment, the etch barrier material 33 may include a material, other than the carbon layer, having a high selectivity with respect to subsequent wet etching. The etch barrier material 33 may include a material that is not etched during wet etching of the spacer 27. For example, when the spacer 27 includes silicon nitride, the etch barrier material 33 may be a material having a high selectivity with respect to the wet etching of silicon nitride. When the spacer 27 includes silicon oxide, the etch barrier material 33 may be a material having a high selectivity with respect to the wet etching of the silicon oxide.

As a comparative example, when the etch barrier material 33 is conformally and thinly formed on a sidewall of the separation groove 32, there may be a limit to protecting the voids 30V of the source channel contacts 31A and 31B during the subsequent wet etching. As another comparative example, when seams or voids exist in the etch barrier material 33, it is difficult to block the path of a wet chemical of the subsequent wet etching process.

As a comparative example, an oxide covering the voids 30V may be formed on the respective sides of the source channel contacts 31A and 31B through selective oxidation without forming the etch barrier material 33. However, since the oxide cannot obtain a sufficient selectivity with respect to the high selectivity phosphoric acid (HSP) in the subsequent wet etching, a path penetrating inside the source channel contacts 31A and 31B is formed.

In this embodiment, since the etch barrier material 33 has excellent gap-fill characteristics and gap-fills the separation groove 32 without a void, the exposure of the voids 30V during a subsequent process may be prevented or mitigated. Since the etch barrier material 33 has a high selectivity with respect to the subsequent wet chemical, it may be possible to prevent or mitigate the voids 30V from being attacked.

The upper surface of the etch barrier material 33 may be positioned at a height covering at least the bottom of the spacer 27. The etch barrier material 33 may have a height that does not expose the lower/upper source layers 12 and 16 and the source channel contacts 31A and 31B. The top surface of the etch barrier material 33 and the top surface of the upper source layer 16 may be positioned at the same level.

As a method of forming the etch barrier material 33, a deposition-etch-deposition (DED) method may be used. The method of forming the etch barrier material 33 according to the DED method may repeat processes of forming an etch barrier material layer and etching the etch barrier material layer. For example, rather than filling the separation groove 32 and the slit 26 with a carbon layer in one deposition process, a carbon layer deposition process and an etching process of the carbon layer may be repeated to selectively fill the separation groove 32.

The respective voids 30V of the source channel contacts 31A and 31B may be covered by the etch barrier material 33. The respective sides of the source channel contacts 31A and 31B contacting the etch barrier material 33 may be oxide-free.

Figure 13:
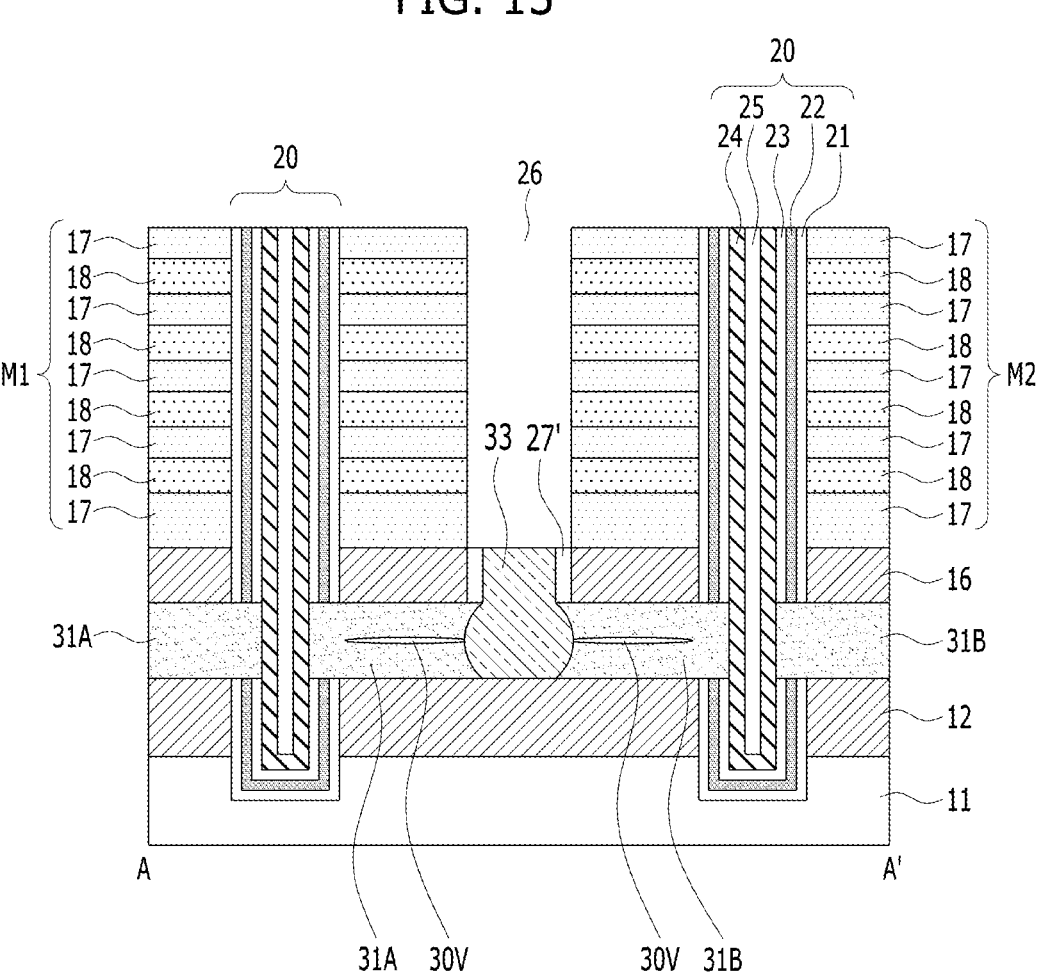

As shown in FIG. 13, a portion of the spacer 27 may be removed. Wet etching using a wet chemical may be performed to remove the spacer 27. For example, when the spacer 27 includes silicon nitride, the spacer 27 may be removed using the high selectivity phosphoric acid (HSP).

As above, while the spacer 27 is being removed, the source channel contacts 31A and 31B may be protected by the etch barrier material 33. For example, the etch barrier material 33 may block a path through which a wet chemical penetrates. In particular, it may be possible to fundamentally block a path through which a wet chemical may be introduced because the etch barrier material 33 of the carbon-base material has excellent gap-fill characteristics. Even if the source channel contacts 31A and 31B include the voids 30V, the voids 30V may be fundamentally blocked from the wet chemical by the etch barrier material 33.

The spacer 27' having a height which is lowered may partially remain on an upper sidewall of the etch barrier material 33.

Figure 14:
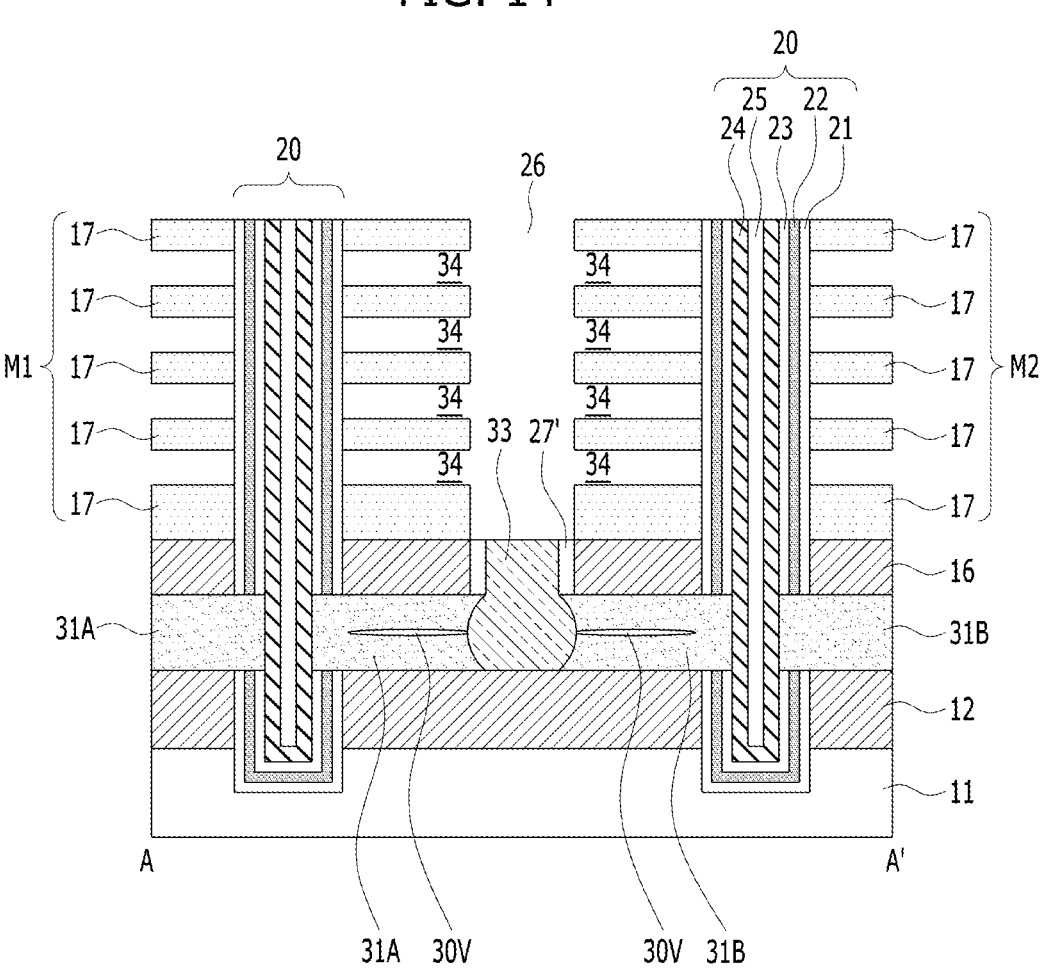
Figure 15:
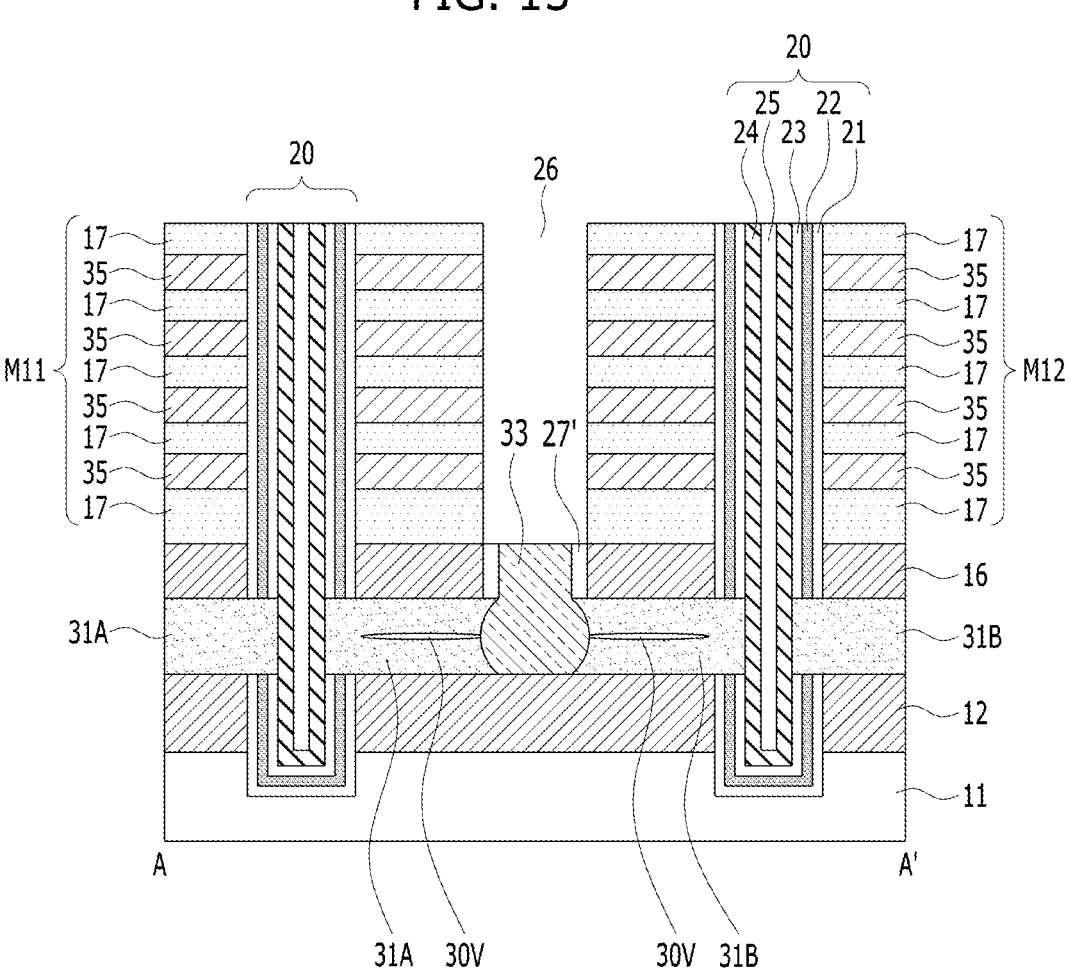

As shown in FIGS. 14 and 15, the sacrificial layers 18 may be replaced with the gate electrodes 35 through the slit 26. For example, the sacrificial layers 18 may be removed to form gate recesses 34 between the insulating layers 17. Subsequently, the gate electrodes 35 may be filled in the gate recesses 34. The gate electrodes 35 may include tungsten, titanium nitride, or a combination thereof.

As the gate electrodes 35 are formed, a first gate stack M11 and a second gate stack M12 may be formed. The first gate stack M11 and the second gate stack M12 may be an alternating stack in which the gate electrodes 35 and the insulating layers 17 alternate. The first gate stack M11 and the second gate stack M12 may be spaced apart from each other by the slit 26. A plurality of vertical channel structures 20 may penetrate through the first gate stack M11 and the second gate stack M12. The source channel contacts 31A and 31B may be disposed under the first gate stack M11 and the second gate stack M12. The channel layers 24 of the vertical channel structures 20 of the first and second gate stacks M11 and M12 may be connected to the source channel contacts 31A and 31B.

Figure 16:
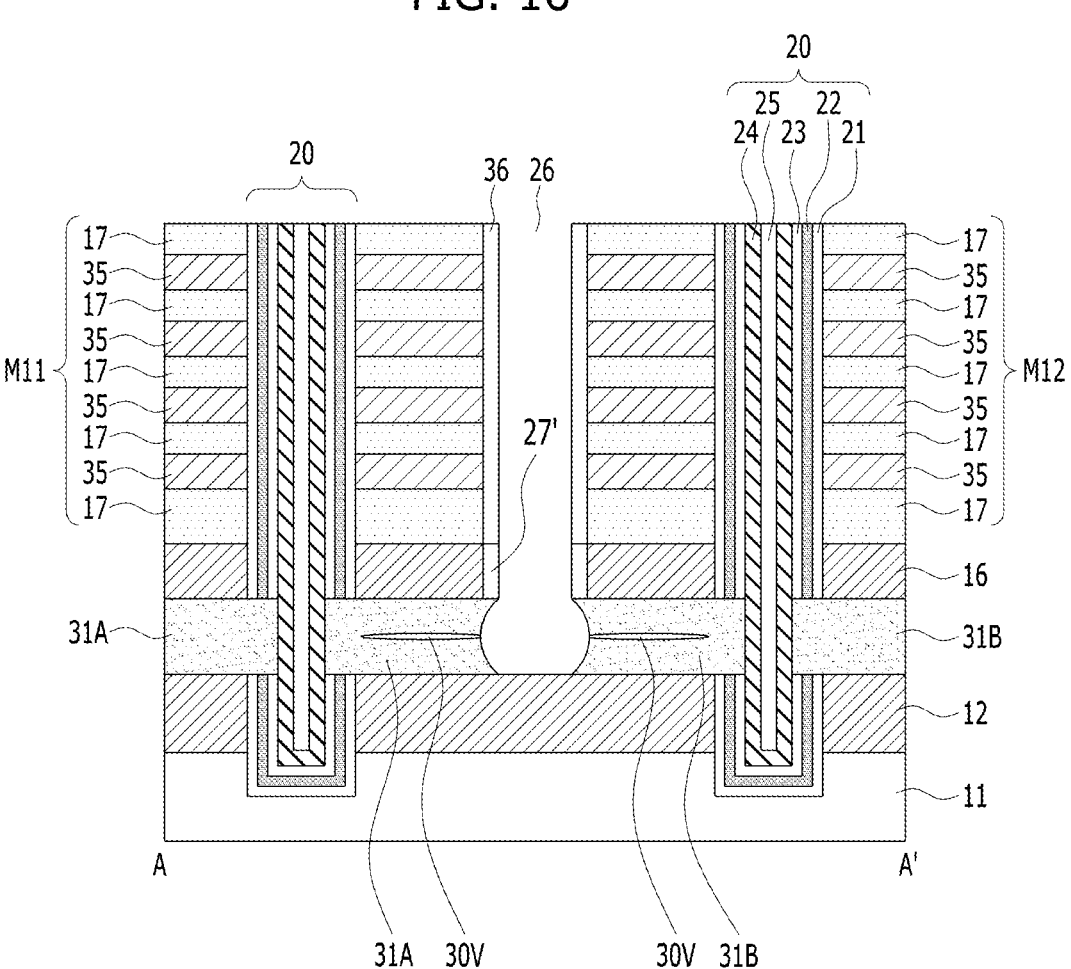

As shown in FIG. 16, a capping spacer 36 may be formed on a sidewall of the slit 26, that is, a sidewall of the gate electrodes 35 on one side thereof. The capping spacer 36 may include silicon oxide, silicon nitride, silicon carbon nitride, or a combination thereof.

Next, the etch barrier material 33 may be removed. The etch barrier material 33 may be removed by an oxygen strip process. Since the carbon layer used as the etch barrier material 33 is removed by the oxygen strip process, attack to the source channel contacts 31A and 31B and the voids 30V may not occur.

Figure 17:
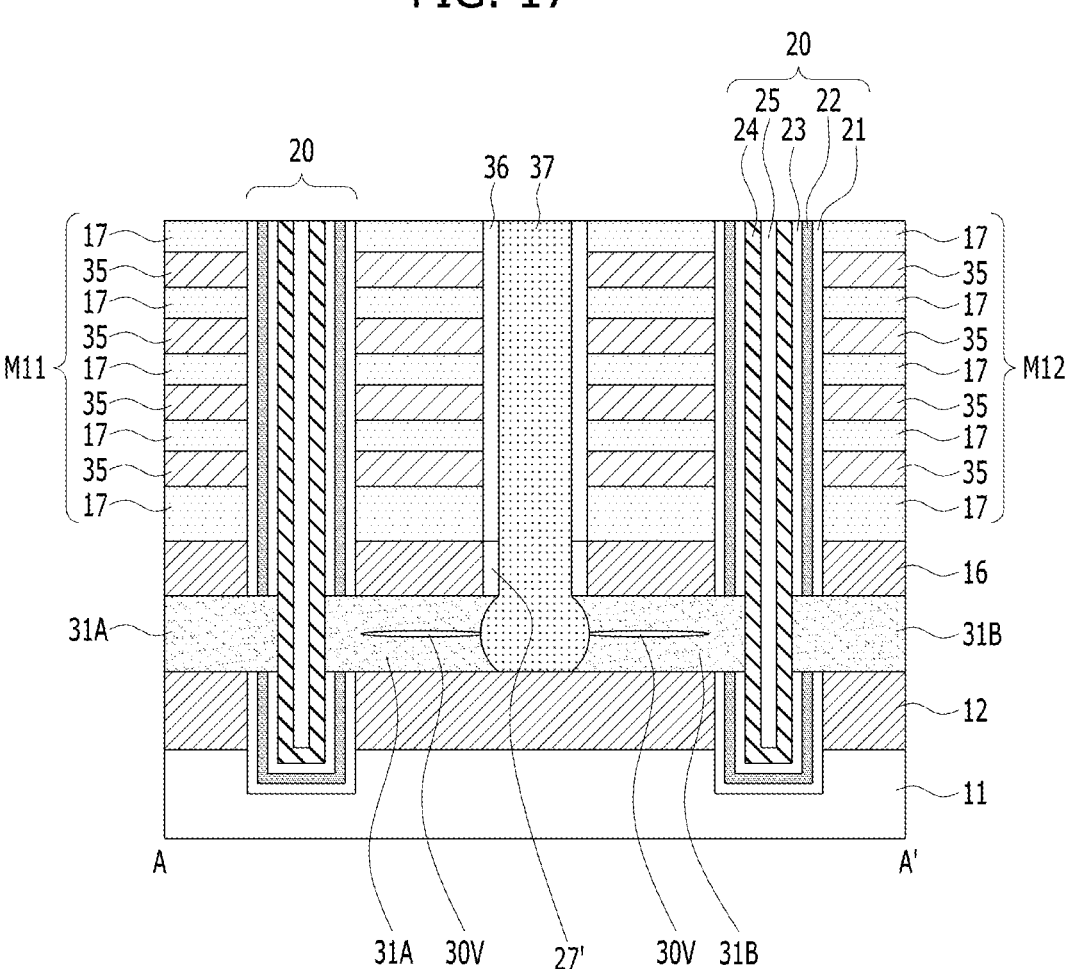

As shown in FIG. 17, a common source line 37 filling the slit 26 may be formed on the capping spacer 36. The common source line 37 may include polysilicon, tungsten, titanium nitride, or a combination thereof.

The above-described embodiments are not limited by the above-described embodiments and the accompanying drawings. It will readily be appreciated by one of ordinary skill in the art that various substitutions, changes, or modifications may be made thereto without departing from the scope of the disclosure.

What is claimed is:

1. A method for fabricating a semiconductor device, the method comprising:
   forming a stack structure including an upper source layer and a lower level sacrificial layer over a semiconductor substrate;
   forming a gate stack over the upper source layer and the lower level sacrificial layer of the stack structure;
   forming a slit penetrating the gate stack to expose the lower level sacrificial layer of the stack structure;
   forming a spacer on a sidewall of the slit;
   forming horizontal recesses by removing the lower level sacrificial layer;
   forming a conductive material in each of the horizontal recesses;
   etching the conductive material to form source channel contacts filling the horizontal recesses, respectively, and to form a separation groove, the separation groove being an entire space dividing the source channel contacts; and
   forming an etch barrier material that completely fills the separation groove,
   wherein the etch barrier material is void-free,
   wherein the etch barrier material fills the separation groove up to, at least, a height covering a bottom of the spacer, and
   wherein the spacer partially remains on both upper sidewalls of the etch barrier material.

2. The method of claim 1, further comprising removing the spacer.

3. The method of claim 1,
   wherein the etch barrier material includes a void-free carbon-base material.

4. The method of claim 1,
   wherein the etch barrier material includes a void-free carbon layer.

5. The method of claim 1,
   wherein the forming of the etch barrier material filling the separation groove includes:
   forming an etch barrier material layer on a sidewall of the slit by filling the separation groove; and
   etching the etch barrier material layer to form the etch barrier material remaining in the separation groove.

6. The method of claim 1, wherein the forming of the etch barrier material filling the separation groove includes:
   forming an etch barrier material layer on a sidewall of the slit and a sidewall of the separation groove; and
   etching the etch barrier material layer,
   wherein the forming of the etch barrier material layer and the etching of the etch barrier material layer are repeated through a deposition-etch-deposition (DED) method.

7. The method of claim 1,
   wherein the conductive material includes polysilicon.

8. The method of claim 1,
   wherein the conductive material and the source channel contacts each includes a void.

9. A method for fabricating a semiconductor device, the method comprising:
   forming a lower level stack including an upper source layer and a sacrificial source layer over a semiconductor substrate and an upper level stack in which a plurality of insulating layers and a plurality of sacrificial layers are alternately stacked over the lower level stack;
   forming a plurality of vertical channel structures each including a channel layer, the channel layer penetrating the upper level stack and the sacrificial layers;

forming a slit dividing the upper level stack into a first alternating stack and a second alternating stack;

exposing the sacrificial source layer by partially etching the lower level stack;

forming a spacer on a sidewall of the slit;

forming horizontal recesses extending from the slit by removing the sacrificial source layer;

forming source channel contacts filling the horizontal recesses, respectively, and a separation groove, the separation groove being an entire space dividing the source channel contacts; and forming an etch barrier material that completely fills the separation groove, wherein the etch barrier material is void-free, wherein the spacer remains on an upper sidewall of the etch barrier material, and wherein the etch barrier material fills the separation groove up to, at least, a height covering a bottom of the spacer, and wherein the spacer partially remains on both upper sidewalls of the etch barrier material.

10. The method of claim 9, further comprising removing the spacer.

11. The method of claim 9, wherein the etch barrier material includes a void-free carbon-base material.

12. The method of claim 9, wherein the etch barrier material includes a void-free carbon layer.

13. The method of claim 9, wherein the forming of the etch barrier material filling the separation groove includes:

forming an etch barrier material layer on a sidewall of the slit by filling the separation groove; and etching the etch barrier material layer to form the etch barrier material remaining in the separation groove.

14. The method of claim 9, wherein the forming of the etch barrier material filling the separation groove includes:

forming an etch barrier material layer on a sidewall of the slit and a sidewall of the separation groove; and etching the etch barrier material layer, wherein the forming of the etch barrier material layer and the etching of the etch barrier material layer are repeated through a deposition-etch-deposition (DED) method.

15. The method of claim 9, wherein the source channel contact includes polysilicon.

16. The method of claim 9, wherein the source channel contacts each includes a void.

17. The method of claim 9, wherein the forming of the source channel contacts and the separation groove includes:

filling a conductive material in the horizontal recesses; and etching the conductive material, wherein the conductive material includes a void disposed in each of the horizontal recesses.

18. The method of claim 9, after the forming of the horizontal recesses, further comprising exposing the channel layer of the vertical channel structures through the horizontal recesses.

19. The method of claim 18, wherein the exposed channel layer directly connects to the source channel contacts.

20. The method of claim 10, after the removing of the spacer, further comprising removing the etch barrier material.

21. The method of claim 9, after the removing of the spacer, further comprising:

replacing the sacrificial layers of the first and second alternating stack with gate electrodes;

forming a capping spacer disposed over the etch barrier material and covering a sidewall of the slit; and removing the etch barrier material.

22. The method of claim 9, wherein the etch barrier material has a height preventing the exposure of the source channel contacts though the slit.

23. The method of claim 1, wherein a top surface of the etch barrier material and a top surface of the upper source layer is positioned at a same level.

24. The method of claim 9, wherein a top surface of the etch barrier material and a top surface of the upper source layer is positioned at a same level.

* * * * *